United States Patent
Lee et al.

(10) Patent No.: US 11,873,576 B2
(45) Date of Patent: *Jan. 16, 2024

(54) SILICON BASED MELTING COMPOSITION AND MANUFACTURING METHOD FOR SILICON CARBIDE SINGLE CRYSTAL USING THE SAME

(71) Applicant: LG Chem, Ltd., Seoul (KR)

(72) Inventors: Horim Lee, Daejeon (KR); Junghwan Kim, Daejeon (KR); Chanyeup Chung, Daejeon (KR); Jung Min Ko, Daejeon (KR)

(73) Assignee: LG Chem, Ltd.

( * ) Notice: Subject to any disclaimer, the term of this patent is extended or adjusted under 35 U.S.C. 154(b) by 13 days.

This patent is subject to a terminal disclaimer.

(21) Appl. No.: 16/630,952

(22) PCT Filed: May 22, 2019

(86) PCT No.: PCT/KR2019/006134
§ 371 (c)(1),
(2) Date: Jan. 14, 2020

(87) PCT Pub. No.: WO2019/225966
PCT Pub. Date: Nov. 28, 2019

(65) Prior Publication Data
US 2020/0224330 A1    Jul. 16, 2020

(30) Foreign Application Priority Data
May 25, 2018    (KR) .................. 10-2018-0059815

(51) Int. Cl.
*C30B 29/36*    (2006.01)
*C30B 15/14*    (2006.01)

(52) U.S. Cl.
CPC .................................. *C30B 15/14* (2013.01)

(58) Field of Classification Search
CPC ....... C30B 15/14; C30B 19/04; C30B 19/062; C30B 29/36
See application file for complete search history.

(56) References Cited

U.S. PATENT DOCUMENTS 7,635,413 B2    12/2009  Kusunoki et al.
9,945,047 B2     4/2018  Shinya et al.
(Continued)

FOREIGN PATENT DOCUMENTS

CN    1863945 A    11/2006
CN    102534797 A    7/2012
(Continued)

OTHER PUBLICATIONS

Chinese Search Report for Application No. CN201980003601.9 dated Dec. 25, 2020.
(Continued)

*Primary Examiner* — Hua Qi
(74) *Attorney, Agent, or Firm* — Lerner David LLP

(57) ABSTRACT

A silicon-based molten composition according to an exemplary embodiment is used in a solution growing method for forming a silicon carbide single crystal, includes silicon (Si), yttrium (Y), and iron (Fe), and is expressed in Formula 1.

$$Si_a Y_b Fe_c$$ [Formula 1]

In Formula 1, the a is equal to or greater than 0.4 and equal to or less than 0.8,
the b is equal to or greater than 0.2 and equal to or less than 0.3, and the c is equal to or greater than 0.1 and equal to or less than 0.2.

7 Claims, 3 Drawing Sheets

(56) References Cited

U.S. PATENT DOCUMENTS

| | | | |
|---|---|---|---|
| 9,951,439 B2 | 4/2018 | Shinya et al. | |
| 10,087,549 B2 | 10/2018 | Danno | |
| 10,167,573 B2 | 1/2019 | Nomura et al. | |
| 2006/0292057 A1 | 12/2006 | Nakamura | |
| 2012/0132130 A1* | 5/2012 | Nomura | C30B 9/10 117/2 |
| 2015/0299896 A1* | 10/2015 | Shirai | C30B 17/00 117/60 |
| 2016/0230309 A1 | 8/2016 | Danno | |
| 2016/0237590 A1 | 8/2016 | Daikoku et al. | |
| 2017/0260647 A1* | 9/2017 | Ujihara | C30B 29/36 |
| 2019/0106806 A1 | 4/2019 | Chung et al. | |

FOREIGN PATENT DOCUMENTS

| | | |
|---|---|---|
| CN | 105531407 A | 4/2016 |
| JP | 2005350324 A | 12/2005 |
| JP | 2006143555 A | 6/2006 |
| JP | 2011251881 A | 12/2011 |
| JP | 2012046384 A | 3/2012 |
| JP | 2013056807 A | 3/2013 |
| KR | 20150066459 A | 6/2015 |
| KR | 20160043001 A | 4/2016 |
| KR | 20160045805 A | 4/2016 |
| KR | 101827928 B1 | 2/2018 |
| KR | 20180035659 A | 4/2018 |
| KR | 20180036388 A | 4/2018 |

OTHER PUBLICATIONS

Hatasa, G. et al., "Thermodynamic calculation of change in carbon solubility for various kinds of slovent for SiC solution growth," Materials Science, The Japan Society of Applied Physics, Published 2016, p. 12067.

Extended European Search Report including Written Opinion for Application No. EP19807632.5, dated Jun. 24, 2020, pp. 1-9.

Felner, et al., Magnetic and structural relationship of RFe2Si2, and R(Fe1-xMx)2Si2(x = 0-1) systems (R = La, Y and Lu, M = Ni,Mn and Cu), Journal of Physics: Condensed Matter, Oct. 2014, p. 476002 (11 pp), vol. 26, No. 47.

Harada, et al., "Solvent Design for High-Purity SiC Solution Growth", Materials Science Forum, ISSN: 1662-9752, Jan. 2017, vol. 897, pp. 32-35, Trans Tech Publications, Switzerland.

International Search Report for PCT/KR2019/006134 dated Aug. 23, 2019, 2 pages.

* cited by examiner

SILICON BASED MELTING COMPOSITION AND MANUFACTURING METHOD FOR SILICON CARBIDE SINGLE CRYSTAL USING THE SAME

CROSS-REFERENCE TO RELATED APPLICATIONS

The present application is a national phase entry under 35 U.S.C. § 371 of International Application No. PCT/KR2019/006134, filed May 22, 2019, which claims priority from Korean Patent Application No. 10-2018-0059815 filed on May 25, 2018, the entire contents of which are incorporated herein by reference.

BACKGROUND OF THE INVENTION

(a) Field of the Invention

The present invention relates a silicon-based molten composition and a method for manufacturing silicon carbide single crystal using the same.

(b) Description of the Related Art

An electrical power semiconductor device is a key device for a next-generation system using electrical energy, such as an electric vehicle and an electric power system, or for radio frequency mobile communication. For this purpose, it is required to select a material that is appropriate for high voltage, high current, and radio frequency. Silicon single crystal has been used as an electrical power semiconductor material, but because of a limit of the physical property, silicon carbide single crystal that has a small energy loss and may be driven under more extreme conditions is being paid high attention.

To grow the silicon carbide single crystal, for example, a sublimation method using silicon carbide as a base material and sublimating the same at a high temperature that is equal to or greater than 2000 degrees (° C.) to grow the single crystal, a solution growing method for applying a crystal pulling method, and a chemical vapor deposition method using a gas source may be used.

In the case of using the chemical vapor deposition method, it may be allowed to grow to a thickness-limited thin membrane level, and in the case of using the sublimation method, defects such as micropipes or stacking errors may be generated, so there is a limit in the viewpoint of production costs. Studies on the solution growing method that has a crystal growing temperature that is lower than that of the sublimation method, and is advantageous in widening and high quality, are in progress.

SUMMARY OF THE INVENTION

The present invention has been made in an effort to provide a silicon-based molten composition for controlling precipitation of an impurity and allowing a long-time stable crystal growing process. The present invention has been made in another effort to provide a silicon-based molten composition for providing silicon carbide single crystal with excellent quality. The present invention has been made in another effort to provide a method for manufacturing silicon carbide single crystal using the silicon-based molten composition.

The technical objects to be achieved by the present invention are not limited to the above-mentioned technical objects. That is, other technical objects that are not mentioned may be obviously understood by those skilled in the art to which the present invention pertains from the following description.

An exemplary embodiment of the present invention provides a silicon-based molten composition used in a solution growing method for forming silicon carbide single crystal, including silicon (Si), yttrium (Y), and iron (Fe), and as expressed in Formula 1:

$$Si_aY_bFe_c \quad \text{[Formula 1]}$$

wherein, in Formula 1, the a is equal to or greater than 0.4 and equal to or less than 0.8, the b is equal to or greater than 0.2 and equal to or less than 0.3, and the c is equal to or greater than 0.1 and equal to or less than 0.2.

The b may be equal to or greater than 0.2 and equal to or less than 0.25, and the c may be equal to or greater than 0.15 and equal to or less than 0.20.

Another embodiment of the present invention provides a method for manufacturing silicon carbide single crystal, including: preparing a silicon carbide seed crystal; preparing a silicon-based molten composition including silicon (Si), yttrium (Y), and iron (Fe), and as expressed in Formula 1; forming a molten solution including the silicon-based molten composition and carbon (C); and obtaining a silicon carbide single crystal on the silicon carbide seed crystal from the molten solution:

$$Si_aY_bFe_c \quad \text{[Formula 1]}$$

wherein, in Formula 1, the a is equal to or greater than 0.4 and equal to or less than 0.8, the b is equal to or greater than 0.2 and equal to or less than 0.3, and the c is equal to or greater than 0.1 and equal to or less than 0.2.

The b may be equal to or greater than 0.2 and equal to or less than 0.25, and the c may be equal to or greater than 0.15 and equal to or less than 0.2.

In the obtaining of a silicon carbide single crystal, a yttrium silicide may not be precipitated.

The forming of a molten solution may include inserting the silicon-based molten composition into a crucible and heating the same.

The heating may include heating the molten solution to be 1800 degrees (° C.).

Carbon solubility of the molten solution may be in a saturated state.

A temperature gradient of −20° C./cm may be formed with reference to a surface of the molten solution, and the silicon carbide seed crystal may be allowed to contact the surface of the molten solution.

A growing speed of the silicon carbide single crystal may be equal to or greater than 0.1 mm/h.

The silicon-based molten composition according to the exemplary embodiment may provide a uniform composition while a crystal growing process is performed, by which the silicon carbide single crystal with excellent quality may be obtained.

DETAILED DESCRIPTION OF THE EMBODIMENTS

Figure 1:
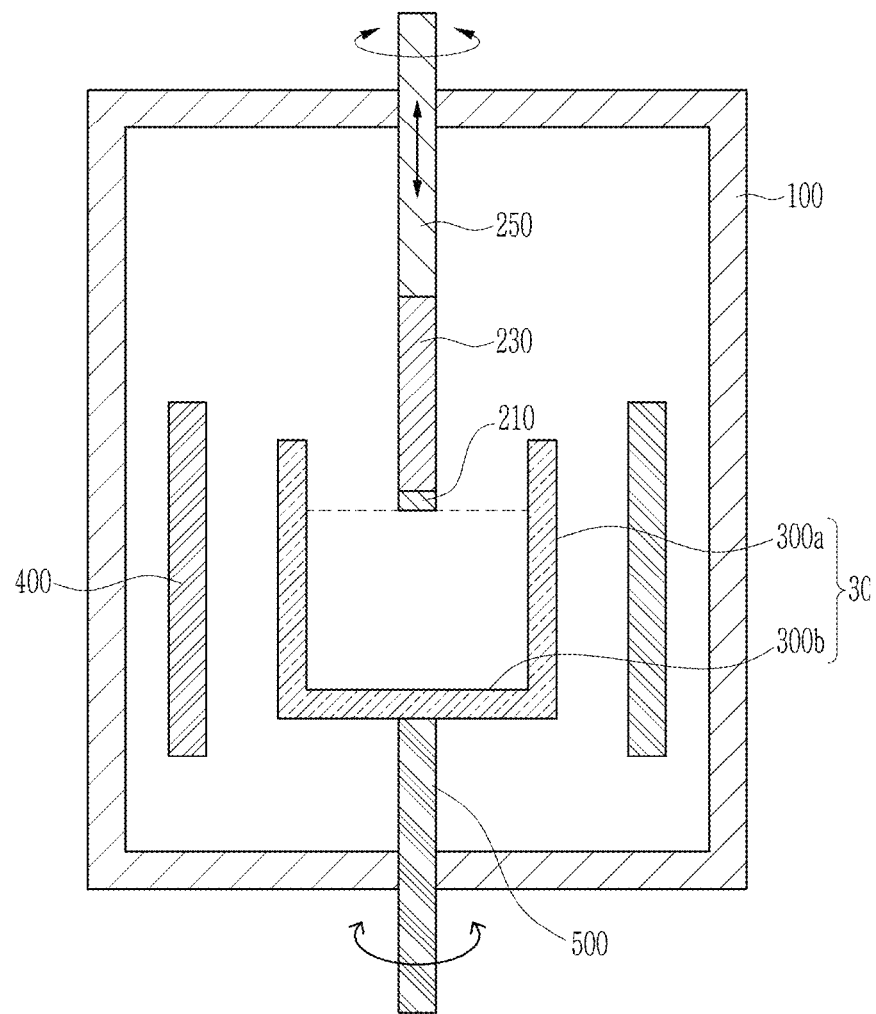
FIG. 1 shows a cross-sectional view of a manufacturing device used for growing silicon carbide single crystal.

Exemplary embodiments of the present invention will be described in detail with reference to the accompanying drawings. In describing the present invention, a description of known functions or configurations will be omitted so as to make the subject matter of the present invention more clear.

To clearly describe the present invention, portions which do not relate to the description are omitted, and like reference numerals designate like elements throughout the specification. The size and thickness of each component shown in the drawings are arbitrarily shown for better understanding and ease of description, but the present invention is not limited thereto.

In the drawings, the thickness of layers, films, panels, regions, etc., are exaggerated for clarity. For better understanding and ease of description, the thicknesses of some layers and areas are exaggerated. It will be understood that when an element such as a layer, film, region, or substrate is referred to as being "on" another element, it can be directly on the other element or intervening elements may also be present.

A silicon-based molten composition according to an exemplary embodiment will now be described.

The silicon-based molten composition according to an exemplary embodiment may include silicon (Si), yttrium (Y), and iron (Fe). The silicon-based molten composition may be expressed as Formula 1.

  [Formula 1]

In Formula 1, the a is equal to or greater than 0.4 and equal to or less than 0.8, the b is equal to or greater than 0.2 and equal to or less than 0.3, and the c is equal to or greater than 0.1 and equal to or less than 0.2. Further, depending on examples, in Formula 1, the a may be equal to or greater than 0.6 and equal to or less than 0.8, the b may be equal to or greater than 0.2 and equal to or less than 0.25, and the c may be equal to or greater than 0.15 and equal to or less than 0.2.

In other words, a content of silicon in the silicon-based molten composition is equal to or greater than 40 at % and equal to or less than 80 at %, a content of yttrium (Y) is equal to or greater than 20 at % and equal to or less than 30 at %, and a content of iron (Fe) is equal to or greater than 10 at % and equal to or less than 20 at %. Depending on examples, a content of silicon in the silicon-based molten composition may be equal to or greater than 60 at % and equal to or less than 80 at %, a content of yttrium (Y) may be equal to or greater than 20 at % and equal to or less than 25 at %, and a content of iron (Fe) may be equal to or greater than 15 at % and equal to or less than 20 at %.

When yttrium (Y) is included in the silicon-based molten composition, solubility of carbon for a molten solution may be increased. The yttrium (Y) may have a high silicon carbide single crystal growing speed at a relative low temperature (e.g., 1800 degrees). Therefore, when the yttrium is included, the single crystal growing process may be performed at the low temperature. Further, a lesser amount of yttrium (Y) is input to the silicon carbide single crystal, so it may be advantageous in silicon carbide single crystal growth with high purity.

When an amount of yttrium (Y) that is less than 15 at % is included in the silicon-based molten composition, carbon solubility on the silicon-based molten composition is reduced, so the silicon carbide single crystal growing speed may be substantially reduced. Further, when amount of yttrium (Y) that is greater than 50 at % is included in the silicon-based molten composition, the silicon carbide may be polycrystallized because of excessively high carbon solubility, and quality of silicon carbide crystal may be deteriorated. The stable growth of silicon carbide single crystal is difficult, so precipitation efficiency may be reduced.

The iron (Fe) may reduce precipitation of an impurity by yttrium when it is included in the silicon-based molten composition. In other words, the iron (Fe) precipitation of the yttrium silicide may be controlled, and the silicon carbide single crystal may be precipitated stably for a long time.

When the silicon-based molten composition includes silicon and yttrium, a solid-phase yttrium silicide may be produced on a surface of the molten solution, and concentration of silicon and yttrium in the molten solution changes by the produced yttrium silicide. By this, carbon solubility on the surface of molten solution that is a crystal growing area abruptly changes, so silicon carbide polycrystals may be precipitated or the grown seed crystal may be dissolved again, and there is a difficulty in performing a long-term stable crystal growing process.

When the silicon-based molten composition includes iron according to an exemplary embodiment, precipitation of the yttrium silicide may be controlled. When the single crystal growing process is performed, the composition of the molten solution may be maintained, so single crystal may be stably obtained.

When an amount of iron (Fe) that is less than 5 at % is included in the silicon-based molten composition, it may be difficult to efficiently perform a function for controlling precipitation of yttrium silicide. In addition, when the amount of iron (Fe) that is greater than 30 at % is included in the silicon-based molten composition, the effect of increasing carbon solubility by yttrium (Y) is excessively controlled, and the carbon solubility on the silicon-based molten composition may be substantially low.

The silicon-based molten composition according to an exemplary embodiment increases silicon (Si), and the carbon solubility in the molten solution, and includes yttrium (Y) for easily obtaining single crystal at a low temperature and iron (Fe) for controlling precipitation of an impurity including yttrium, thereby obtaining silicon carbide single crystal with excellent quality. Further, the silicon-based molten composition according to an exemplary embodiment may provide a continuous single crystal growth condition.

A method for obtaining silicon carbide single crystal by using the above-described silicon-based molten composition will now be described with reference to a manufacturing device of FIG. 1. FIG. 1 shows a cross-sectional view of a manufacturing device used for growing silicon carbide single crystal.

Referring to FIG. 1, the silicon carbide single crystal manufacturing device may include a reaction chamber 100, a crucible 300 provided inside the reaction chamber 100, seed crystal 210 extending into the crucible 300, a seed crystal supporter 230 connected to the seed crystal 210, a moving member 250, and a heating member 400 for heating the crucible 300.

The reaction chamber 100 has a close and seal form including an empty inner space, and the inner space may be maintained in its atmosphere such as a constant pressure. Although not shown, a vacuum pump and an atmosphere controlling gas tank may be connected to the reaction chamber 100. The inside of the reaction chamber 100 may become a vacuum state by using the vacuum pump and the atmosphere controlling gas tank, and an inert gas such as argon gas may be charged therein.

The silicon carbide seed crystal 210 may be connected to the seed crystal supporter 230 and the moving member 250 and may be provided inside the crucible 300, and particularly it may be disposed to contact a molten solution provided inside the crucible 300. The molten solution may include the above-noted silicon-based molten composition, and no same description will be provided.

According to an exemplary embodiment, a meniscus may be formed between the surface of the silicon carbide seed crystal 210 and the molten solution. The meniscus represents a curved side that is formed on the molten solution by a surface tension generated when a lower side of the silicon carbide seed crystal 210 contacts the molten solution and is then slightly lifted up. When the meniscus is formed to grow the silicon carbide single crystal, generation of polycrystals may be suppressed to obtain high-quality single crystal.

The silicon carbide seed crystal 210 is made of silicon carbide single crystal. A crystal structure of the silicon carbide seed crystal 210 corresponds to the crystal structure of the silicon carbide single crystal to be manufactured. For example, in the case of manufacturing a 4H polytype silicon carbide single crystal, 4H polytype silicon carbide seed crystal 210 may be used. In the case of using a 4H polytype silicon carbide seed crystal 210, a crystal growing side may be a side (0001) or a side (000-1), or a side that is slanted at equal to or less than 8 degrees from the side (0001) or the side (000-1).

The seed crystal supporter 230 connects the silicon carbide seed crystal 210 and the moving member 250. The seed crystal supporter 230 includes a first end connected to the moving member 250 and a second end connected to the seed crystal 210.

The seed crystal supporter 230 may be connected to the moving member 250, and may move in up and down directions along a height direction of the crucible 300. In detail, the seed crystal supporter 230 may be moved inside the crucible 300 for the process for growing silicon carbide single crystal, or it may be moved outside the crucible 300 after the process for growing silicon carbide single crystal is completed. Further, the present specification has described the example in which the seed crystal supporter 230 moves in the up and down directions, and without being limited to this, it may move or rotate in any directions, and it may include means known to a skilled person in the art.

The seed crystal supporter 230 may be mounted to the moving member 250. To obtain the silicon carbide single crystal, the seed crystal supporter 230 may be combined to the moving member 250 and may be provided in the crucible 300, and it may be separated from the moving member 250 when the single crystal growing process is finished.

The moving member 250 may be connected to a driver (not shown), and may be moved into or rotated in the chamber 100. The moving member 250 may include a means known to a skilled person in the art so as to move up and down or rotate.

The crucible 300 may be installed in the reaction chamber 100, it may have a vessel shape of which an upper side is opened, and it may include an external circumferential surface 300a and a lower side 300b excluding the upper side. The crucible 300 allows any shapes for forming the silicon carbide single crystal, without being limited to the above-described shapes. The crucible 300 may be received by inputting a molten base material such as silicon or silicon carbide powder.

The crucible 300 may be made of a material including carbon such as graphite or silicon carbide, and the crucible 300 with such a material may be applied as a source of the carbon base material. In another way, without being limited to this, a crucible with a ceramic material may be used, and in this instance, a material or a source for supplying carbon may be additionally provided.

The heating member 400 may fuse or heat the material received in the crucible 300 by heating the crucible 300. The heating member 400 may use a resistance type of heating means or an inductive heating type of heating means. In detail, the heating member 400 may be formed as a self-heating resistance type, or the heating member 400 may be formed with an induction coil and a radio frequency current is allowed to flow through the induction coil, so the crucible 300 may be formed as an inductive heating type. However, without being limited to the above-described method, any kinds of heating members are usable.

The device for manufacturing a silicon carbide according to an exemplary embodiment may further include a rotating member 500. The rotating member 500 may be combined to a lower side of the crucible 300 and may rotate the crucible 300. The molten solution with a uniform composition may be provided by the rotation of the crucible 300, so high-quality silicon carbide single crystal may grow on the silicon carbide single crystal 210.

A method for manufacturing silicon carbide single crystal using the above-described device for manufacturing a silicon-based molten composition and silicon carbide single crystal will now be described.

An initial molten base material including the above-described silicon-based molten composition is input to the crucible 300. The initial melting base material may be a powder, but is not limited thereto. When the crucible 300 includes a carbon material, the initial molten base material may not additionally include carbon, and without being limited thereto, the initial molten base material may include carbon.

The crucible 300 to which the initial molten base material is supplied is heated by using the heating member 400 under a noble atmosphere such as argon gas. As it is heated, the initial molten base material in the crucible 300 is changed to the molten solution including carbon (C), silicon (Si), yttrium (Y), and iron (Fe).

The molten solution may be heated so that it may reach a predetermined temperature (e.g., 1800 degrees), and carbon solubility in the molten solution at a predetermined temperature may be in a saturated state. After this, a temperature gradient for the temperature to reduce toward the surface from the inside of the molten solution in the crucible 300 by position relationship control of the crucible 300 and the heating member 400 is formed. The carbon in the molten solution becomes an oversaturated state around the seed crystal 210, and the silicon carbide single crystal grows on the seed crystal 210 with the oversaturated degree as a driving force.

As the silicon carbide single crystal grows, a condition for precipitating silicon carbide from the molten solution may change. In this instance, the molten solution may be maintained with a composition within a predetermined range by adding silicon and carbon so as to satisfy the composition of the molten solution as times passes. The added silicon and carbon may be input continuously or non-continuously.

When the silicon-based molten composition according to an exemplary embodiment of the present invention is used, carbon solubility in the molten solution increases, the single crystal may be easily obtained at the low temperature, and precipitation of an impurity including yttrium is suppressed, thereby obtaining the silicon carbide single crystal with excellent quality.

Figure 2:
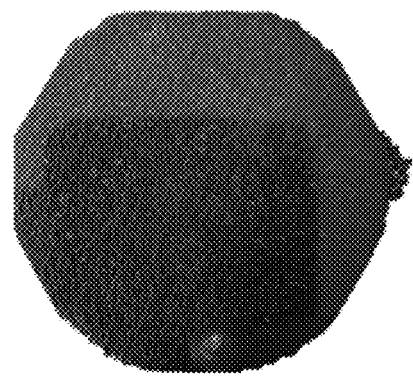
FIG. 2 shows a single crystal image precipitated by using a silicon-based molten composition according to an example.
Figure 3:
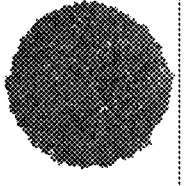
FIG. 3 shows a single crystal image precipitated by using a silicon-based molten composition according to a comparative example.

A single crystal precipitated using a silicon-based molten composition according to an exemplary embodiment of the present invention and a comparative example will now be described with reference to FIG. 2 and FIG. 3 together with Table 1. FIG. 2 shows a single crystal image precipitated by using a silicon-based molten composition according to an example, and FIG. 3 shows a single crystal image precipitated by using a silicon-based molten composition according to a comparative example.

Raw materials corresponding to Comparative Examples 1 to 8 and Examples 1 to 3 are input to a graphite crucible in a crystal growth furnace, vacuum exhaustion is performed, and gas of Ar at 1 atmosphere is injected. The molten solution is manufactured by applying heat up to 1800 degrees (° C.) that is a growing temperature, the temperature is maintained, and it is then stood by until the carbon concentration in the molten solution reaches the saturated state. A temperature gradient of −20° C./cm is formed downward with reference to the surface of the molten solution, the SiC seed crystal of 4H is allowed to gradually descend toward the surface of the molten solution, and it is then allowed to contact the same to thus perform a single crystal growth for twelve hours. After the crystal growth is finished, the seed crystal is pulled from the molten solution and is then cooled to compare the single crystal growing speeds, whether a yttrium silicide is precipitated, and surface states of single crystal. The carbon solubility is calculated by using FactSage that is a thermodynamic simulation.

nickel and aluminum, it is found that precipitation of the yttrium silicide is not suppressed.

In the case of Comparative Example 4, Comparative Example 5, Comparative Example 6, and Comparative Example 8, it is found that the yttrium silicide is not precipitated as the silicon-based molten composition includes iron. It is found that the precipitation of yttrium silicide is suppressed by iron, and a surface defect is not observed from the obtained single crystal. However, in the case of Comparative Example 4, Comparative Example 5, Comparative Example 6, and Comparative Example 8, the crystal growing speed is observed to be substantially slow according to the included content of yttrium and iron.

When the yttrium of 10 at % is included as in Comparative Example 5, a very small amount of yttrium is included, so it is found that the increasing effect of carbon solubility caused by yttrium is very much less. In the case of Comparative Example 5, it is found that carbon solubility is about 2.8% and is accordingly very low.

Comparative Example 6 shows the case that 40 at % of iron is included, and the iron suppresses the increasing effect of carbon solubility by yttrium, so the case of Comparative Example 6 shows that the carbon solubility is about 3.6% which is very low.

Comparative Example 8 shows the case that 10 at % of yttrium is included. Comparative Example 8 shows that yttrium has a low effect of increasing carbon solubility, so the carbon solubility may be substantially low (4.1%), and hence, it is found that the crystal growth is slow.

Comparative Example 7 shows that 3 at % of iron is included, and it is found that the effect for the iron to

TABLE 1

| | Composition | Growing temperature (° C.) | Carbon solubility (%) | Crystal growing speed (mm/h) | Yttrium silicide Precipitation | Crystal growing result |
|---|---|---|---|---|---|---|
| Comparative Example 1 | $Si_{0.7}Y_{0.3}$ | 1800 | 9.5 | X | Precipitated | Surface defect |
| Comparative Example 2 | $Si_{0.6}Y_{0.3}Ni_{0.1}$ | 1800 | 4.8 | X | Precipitated | Surface defect |
| Comparative Example 3 | $Si_{0.6}Y_{0.3}Al_{0.1}$ | 1800 | 4.5 | X | Precipitated | Surface defect |
| Comparative Example 4 | $Si_{0.3}Y_{0.6}Fe_{0.1}$ | 1800 | 8.6 | −0.02 | Not found | Slow growth |
| Comparative Example 5 | $Si_{0.8}Y_{0.1}Fe_{0.1}$ | 1800 | 2.8 | −0.01 | Not found | Slow growth |
| Comparative Example 6 | $Si_{0.3}Y_{0.3}Fe_{0.4}$ | 1800 | 3.6 | −0.01 | Not found | Slow growth |
| Comparative Example 7 | $Si_{0.6}Y_{0.37}Fe_{0.03}$ | 1800 | 15.3 | X | Precipitated | Surface defect |
| Comparative Example 8 | $Si_{0.6}Y_{0.1}Fe_{0.3}$ | 1800 | 4.1 | −0.02 | Not found | Slow growth |
| Example 1 | $Si_{0.6}Y_{0.3}Fe_{0.1}$ | 1800 | 14.5 | 0.40 | Not found | Good quality |
| Example 2 | $Si_{0.6}Y_{0.25}Fe_{0.15}$ | 1800 | 11.75 | 0.35 | Not found | Good quality |
| Example 3 | $Si_{0.6}Y_{0.2}Fe_{0.2}$ | 1800 | 9.8 | 0.21 | Not found | Good quality |

Referring to Table 1, it is found that, when the silicon-based molten composition includes silicon and yttrium in a like manner of Comparative Example 1, the carbon solubility may be relatively high (9.5%), but the yttrium silicide is precipitated. Precipitation of the yttrium silicide hinders growth of the single crystal, so it is found that the result of crystal growth is a surface defect.

As described in Comparative Example 2 and Comparative Example 3, nickel (Ni) and aluminum (Al) are added so as to control precipitation of the yttrium silicide, but it is found that the yttrium silicide is still precipitated. In the case of suppress precipitation of yttrium silicide is very small. Although the silicon-based molten composition includes iron, it is shown that the yttrium silicide is precipitated and the surface of the single crystal has defects.

Regarding the surface of the silicon carbide single crystal, as shown in FIG. 3, it is found that the surface states according to Comparative Example 1, Comparative Example 2, Comparative Example 4, Comparative Example 5, and Comparative Example 7 are not good.

On the contrary, in the case of Examples 1 to 3, predetermined yttrium is included, so the carbon solubility is shown to be 14.5%, 11.75%, and 9.8%, which are relatively high values compared to the comparative examples. The crystal growing speeds are 0.40 mm/h, 0.35 mm/h, and 0.21 mm/h to thus find that the crystal growth is performed quickly. According to an exemplary embodiment of the present invention, the single crystal growing speed may be equal to or greater than about 0.1 mm/h.

Further, it is found that, as an appropriate amount of iron (Fe) is included, precipitation of the yttrium silicide is suppressed, and as shown in FIG. 2, quality of the single crystal is good.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A method for manufacturing a silicon carbide single crystal, comprising:
   preparing a silicon carbide seed crystal;
   preparing a silicon-based molten composition including silicon (Si), yttrium (Y), and iron (Fe), and as expressed in Formula 1;
   forming a molten solution including the silicon-based molten composition and carbon (C); and
   obtaining the silicon carbide single crystal on the silicon carbide seed crystal from the surface of the molten solution:

$$Si_aY_bFe_c \quad \text{[Formula 1]}$$

wherein, in Formula 1, the a is equal to or greater than 0.5 and equal to or less than 0.7, the b is equal to or greater than 0.2 and equal to or less than 0.3, and the c is equal to or greater than 0.1 and equal to or less than 0.2,
   wherein in the obtaining of the silicon carbide single crystal, a yttrium silicide is not precipitated, and
   wherein a growing speed of the silicon carbide single crystal is equal to or greater than 0.1 mm/h.

2. The method of claim 1, wherein
   the b is equal to or greater than 0.2 and equal to or less than 0.25, and the c is equal to or greater than 0.15 and equal to or less than 0.2.

3. The method of claim 1, wherein
   the forming of the molten solution includes inserting the silicon-based molten composition into a crucible and heating the silicon-based molten composition in the crucible.

4. The method of claim 3, wherein
   the heating includes heating the molten solution to be 1800 degrees (° C.).

5. The method of claim 3, wherein
   a carbon solubility of the molten solution is in a saturated state.

6. The method of claim 5, wherein
   a temperature gradient of −20° C./cm is formed in a direction from the inside of the molten solution to the surface of the molten solution, and the silicon carbide seed crystal is allowed to contact the surface of the molten solution.

7. The method of claim 1, wherein the silicon-based molten composition consists of silicon (Si), yttrium (Y), and iron (Fe), and as expressed in the Formula 1.

* * * * *